(12) United States Patent
Sumida et al.

(10) Patent No.: US 9,024,302 B2
(45) Date of Patent: May 5, 2015

(54) DISPLAY DEVICE

(71) Applicant: Canon Kabushiki Kaisha, Tokyo (JP)

(72) Inventors: Noa Sumida, Chiba (JP); Kiyofumi Sakaguchi, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 149 days.

(21) Appl. No.: 13/917,356

(22) Filed: Jun. 13, 2013

(65) Prior Publication Data

US 2013/0277659 A1 Oct. 24, 2013

Related U.S. Application Data

(63) Continuation of application No. 12/893,929, filed on Sep. 29, 2010, now Pat. No. 8,497,498.

(30) Foreign Application Priority Data

Oct. 2, 2009 (JP) ................. 2009-230648

(51) Int. Cl.
*H01L 27/32* (2006.01)
*H01L 51/52* (2006.01)

(52) U.S. Cl.
CPC ........ *H01L 51/5253* (2013.01); *H01L 51/5246* (2013.01); *H01L 51/5256* (2013.01); *H01L 27/3244* (2013.01); *H01L 51/5237* (2013.01); *H01L 51/5275* (2013.01); *H01L 27/32* (2013.01)

(58) Field of Classification Search
CPC ....................................................... H01L 27/32
USPC ..................................................... 257/40, 100
See application file for complete search history.

(56) References Cited

U.S. PATENT DOCUMENTS

| | | | |
|---|---|---|---|
| 5,936,347 A * | 8/1999 | Isaka et al. .................... 313/509 |
| 6,660,409 B1 * | 12/2003 | Furukawa et al. ............ 428/690 |
| 7,745,840 B2 * | 6/2010 | Wang et al. ..................... 257/95 |
| 7,852,563 B2 * | 12/2010 | Mizutani et al. ............... 359/620 |
| 2005/0007669 A1 * | 1/2005 | Sakai ............................. 359/619 |
| 2011/0031514 A1 * | 2/2011 | Sakaguchi et al. .............. 257/88 |
| 2012/0057100 A1 * | 3/2012 | Masuda et al. ................. 349/62 |
| 2012/0223873 A1 * | 9/2012 | Ohta ............................... 345/76 |

* cited by examiner

*Primary Examiner* — Evan Pert
(74) *Attorney, Agent, or Firm* — Canon U.S.A. Inc., IP Division (57) ABSTRACT

A display device includes an array of pixels including a plurality of organic EL elements each having a pair of electrodes and an organic compound layer including a light-emitting layer and disposed between the pair of electrodes and includes a protective layer disposed on the plurality of the organic EL elements. The protective layer has a first protective layer made of an inorganic material, a second protective layer made of a resin material and disposed on the first protective layer, and a third protective layer made of an inorganic material and disposed on the second protective layer. The second protective layer includes lenses for diverging at least part of light emitted from the light-emitting layer. The lenses have an elongated concave shape.

9 Claims, 8 Drawing Sheets

DISPLAY DEVICE

CROSS REFERENCE TO RELATED APPLICATIONS

This application is a Continuation of U.S. patent application Ser. No. 12/893,929 filed Sep. 29, 2010, which claims priority to JP 2009-230648 filed Oct. 2, 2009, each of which are hereby incorporated by reference herein in their entireties.

BACKGROUND OF THE INVENTION

1. Field of the Invention

The present invention relates to a display device having organic electroluminescent (EL) elements and specifically relates to a display device having organic EL elements that can improve view angle characteristics.

2. Description of the Related Art

Organic compound layers, such as electrodes of organic EL elements, light-emitting layers, and hole-transporting layers, are easily corroded or oxidized by reaction with moisture or oxygen in air. Such corrosion and oxidation significantly develop non-light-emitting portions, so-called dark spots, and cause characteristic degradation of the organic EL elements as time passes. Factors causing dark spots will now be described.

Usually, the surfaces of the organic EL elements are covered with a protective layer for preventing the organic compound layer from being brought into contact with moisture or oxygen in air. However, pinholes may be partially formed in the protective layer due to particles such as etching residues generated in the production process and dust. Then, oxygen and moisture penetrate through the pinholes into the insides of the elements to form dark spots. In order to prevent the penetration of oxygen and moisture, the protective layer may be thick so as to sufficiently cover the particles. However, since a protective layer made of an inorganic material, such as SiN, is formed by CVD or the like, it takes a long time to form the layer to be thick, resulting in a problem of increasing cost. At the same time, a design is proposed where a resin layer, which can be conveniently formed by application or the like, is formed for sufficiently covering the particles and a protective layer of a dense inorganic material is further formed on the resin layer.

Japanese Patent Laid-Open No. 2002-025765 discloses a sealing technique involving forming of a protective layer having a laminate structure composed of silicon nitrided oxide (SiON) layer/organic material layer/silicon nitrided oxide (SiON) layer on the upper electrode of the organic EL element.

Furthermore, in Japanese Patent Laid-Open No. 2005-19148, in order to give satisfactory irradiation distribution and provide natural visibility, a micro optical element having negative refractive power is formed on the upper surface of a covering layer (for example, $SiO_2$) covering the organic EL element.

Incidentally, combination of the protective layer having a laminate structure disclosed in Japanese Patent Laid-Open No. 2002-025765 and the micro optical element (concave microlens) having a negative refractive index shown in Japanese Patent Laid-Open No. 2005-19148 causes the following problems.

That is, when a microlens array made of a resin is disposed on a laminate structure serving as a protective layer, the microlens layer itself is exposed to the exterior atmosphere. Therefore, moisture in the atmosphere readily penetrates into the microlenses to cause changes in the refractive index and the shape due to swelling, resulting in a decrease in lens function.

In order to solve this problem, an outermost protective layer made of an inorganic material such as SiN may be formed on the surfaces of the microlenses. In such a case, the layer structure has five layers including the protective layer composed of three layers and the resin layer constituting the microlenses, which leads to an increase of cost.

In addition, in such a structure, the number of layer interfaces constituting reflecting interfaces is increased, and thereby the quantity of emitted light that is trapped in the element is increased. As a result, the total quantity of light extracted to the outside is decreased, and also thereby luminance in an oblique direction is decreased, which leads to degradation in view angle characteristics.

SUMMARY OF THE INVENTION

A first aspect of the present invention relates to a display device including an array of pixels having a plurality of organic EL elements each having a pair of electrodes and an organic compound layer including a light-emitting layer and disposed between the pair of electrodes, and including a protective layer disposed on the plurality of the organic EL elements. The protective layer has a first protective layer made of an inorganic material, a second protective layer made of a resin material and disposed on the first protective layer, and a third protective layer made of an inorganic material and disposed on the second protective layer. The second protective layer includes lenses for diverging at least part of light emitted from the light-emitting layer, and the lenses have an elongated concave shape.

Another aspect of the present invention relates to a display device including an array of pixels having organic EL elements each having a pair of electrodes and an organic compound layer including a light-emitting layer and disposed between the pair of electrodes, and including a protective layer disposed on the plurality of the organic EL elements. The protective layer includes elongated concave-shaped lenses for diverging at least part of light emitted from the light-emitting layer.

Yet another aspect of the present invention relates to a display device including an array of pixels including organic EL elements each having a pair of electrodes and an organic compound layer including a light-emitting layer and disposed between the pair of electrodes, and including elongated concave-shaped lenses for diverging at least part of light emitted from the light-emitting layer.

Further features of the present invention will become apparent from the following description of exemplary embodiments with reference to the attached drawings.

DESCRIPTION OF THE EMBODIMENTS

Organic EL Display Device

A display device according to embodiments of the present invention will be described with reference to the drawings below.

Figure 1:
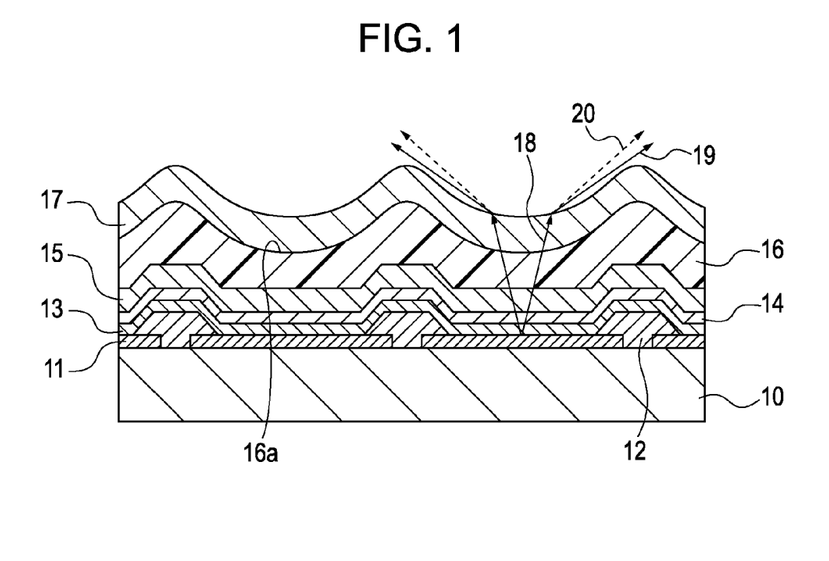
FIG. 1 is a partial cross-sectional view illustrating an embodiment of the present invention.

FIG. 1 is a partial cross-sectional view of a display device according to an Embodiment of the present invention. The display device is a top-emission-type where light is extracted to the upper direction in FIG. 1 from the upper side of organic EL elements formed on a board.

The display device according to aspects of the present invention includes a board 10 and a plurality of pixels formed in a matrix form to constitute a display region on the board 10. In this description, the term "pixel" means a region corresponding to one light-emitting element. According to aspects of the present invention, an organic EL element serving as a light-emitting element is formed in each of the plurality of pixels, and pixel separation layers 12 separating each of the pixels are disposed between the organic EL elements. In addition, the organic EL elements each have a pair of electrodes, namely, an anode electrode 11 and a cathode electrode 14, and an organic compound layer 13 (hereinafter, referred to as organic EL layer) including a light-emitting layer and disposed between the pair of electrodes. Specifically, the anode electrode 11 patterned for each pixel is formed on the board 10, and the organic EL layer 13 is formed on the anode electrodes 11, and the cathode electrode 14 is further formed on the organic EL layer 13.

The anode electrodes 11 are made of, for example, an electrically conductive metal material having a high reflectance, such as Ag. In addition, the anode electrodes 11 may be a laminate constituted of a layer made of such a metal material and a layer made of an electrically conductive transparent material such as indium-tin-oxide (ITO) having an excellent hole-injection property.

On the other hand, the cathode electrode 14 is a common electrode for the plurality of the organic EL elements and has a semi-reflective or light-permeable constitution such that light emitted from the light-emitting layer can exit to the outside of the element. Specifically, in the case that the cathode electrode 14 is semi-reflective for enhancing the interference effect inside the element, the cathode electrode 14 is formed as a layer having a thickness of 2 to 50 nm and made of an electrically conductive metal material having an excellent electron-injection property, such as Ag and AgMg. Incidentally, the term "semi-reflective" means a property of partially reflecting and partially permeating light emitted at the inside of an element and refers to one having a visible light reflectance of 20 to 80%. In addition, the term "light-permeability" refers to one having a visible light transmittance of 80% or more.

In addition, the organic EL layer 13 has a monolayer or multilayer structure including at least a light-emitting layer. Examples of the structure of the organic EL layer 13 include a four-layer structure comprising a hole-transporting layer, a light-emitting layer, an electron-transporting layer, and an electron-injection layer; and a three-layer structure comprising a hole-transporting layer, a light-emitting layer, and an electron-transporting layer. The materials for the organic EL layer 13 may be known materials.

The board 10 is provided with pixel circuits such that each of the organic EL elements can be independently driven. The pixel circuits comprise a plurality of transistors (not shown). The board 10 provided with the transistors is covered with an interlayer insulating layer (not shown) made of SiN and provided with contact holes for electrically connecting the transistors to the respective anode electrodes 11. Furthermore, a planarizing layer (not shown) made of an acrylic resin for absorbing the surface asperities due to the pixel circuits and thus planarizing the surface is disposed on the interlayer insulating layer.

Furthermore, a protective layer for protecting the organic EL layer 13 from oxygen and moisture in air is disposed on the cathode electrode 14.

The protective layer has a three-layer structure comprising a first protective layer 15, a second protective layer 16, and a third protective layer 17 in this order from the cathode electrode 14 side.

The first protective layer 15 is made of an inorganic material such as SiN or SiON and protects the organic EL layer 13 from moisture contained in the resin material constituting the second protective layer 16, which is laminated on the first protective layer 15. In addition, the first protective layer 15 can have a function of absorbing the stress generated when the resin material is cured. The first protective layer 15 can have a thickness of 0.1 μm or more and 1.0 μm or less and can be formed by CVD.

The second protective layer 16 is made of a transparent resin material with a low moisture content, for example, 100 ppm or less. Regarding the transparency, the second protective layer 16 can have a visible light transmittance of 90% or more when the thickness is 10 μm. The resin material can be a thermosetting resin, a photo-setting resin, or a thermoplastic resin. Examples of these resins include epoxy resins, polyurethane setting-type resins, phenol resins, urea resins, melamine resins, alkyd resins, acrylic reactive resins, and formaldehyde resins. Furthermore, examples of these resins include silicon resins, epoxy-polyamide resins, mixtures of a polyester resin and an isocyanate prepolymer, mixtures of a polyester polyol and a polyisocyanate, mixtures of a polyurethane and a polyisocyanate, polymers or copolymers having structural units of vinyl chloride, vinyl acetate, vinyl alcohol, maleic acid, acrylic acid, an acrylic ester, vinylidene chloride, acrylonitrile, methacrylic acid, a methacrylic ester, styrene, butadiene, ethylene, vinyl butyral, vinyl acetal, vinyl ether, etc., and various types of rubber resins. As described below, the second protective layer 16 includes concave lenses. Therefore, the second protective layer 16 does not have a uniform thickness. The minimum thickness, that is, the thinnest portion, can have a thickness of 1 μm or more but not higher than 50 μm. The thickest portion can have a thickness of from 10 μm to 100 nm. The second protective layer 16 can be formed by coating or printing.

The third protective layer 17 is made of an inorganic material such as SiN and prevents penetration of oxygen and moisture from the outside to the insides of the organic EL elements. The third protective layer 17 can have a thickness of 0.5 μm or more and 5.0 μm or less and can be formed by CVD.

The second protective layer 16 includes a plurality of concave lenses 16a in an array form on the light-extracting side (the upper direction of FIG. 1). The lenses 16a are formed by processing the resin material constituting the second protective layer 16. Specifically, the lenses 16a can be formed by a method such as embossing. The lenses 16a can be arranged in such a manner that one lens 16 corresponds to one pixel (that is, one organic EL element), but a plurality of lenses may correspond to one pixel, or one lens may correspond to a plurality of pixels. Furthermore, the third protective layer 17 is formed along the shapes of the lenses 16a.

By forming such a structure, for example, when each pixel is provided with one lens 16a, the light emitted from the organic EL layer 13 permeates through the transparent cathode electrode 14 and then permeates through the first protective layer 15, the lens array formed in the second protective layer 16, and the third protective layer 17 to be emitted to the outside of the organic EL elements.

Figure 2:
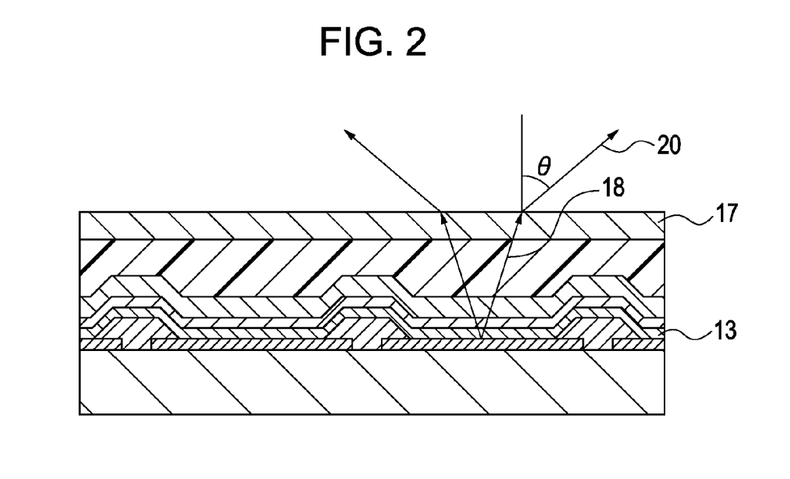
FIG. 2 is a partial cross-sectional view illustrating a known structure.

If the lenses 16a are not formed (FIG. 2), the light 18 obliquely emitted from the light-emitting layer of the organic EL layer 13 is further tilted (in the direction of 20) when it is emitted from the third protective layer 17. On the other hand, as shown in FIG. 1, in the structure that the lenses 16a are formed, the emission angle of the light 19 emitted from the third protective layer 17 further verges (in the direction of 19) toward the in-plane direction of the board, compared to the case of not having the lenses 16a. Therefore, the function of dispersing light to oblique directions in the case of having the lenses 16a is higher than that of the case of not having the lenses 16a. That is, the view angle characteristics of a display device can be increased. Here, the term "increase of the view angle characteristics" means that the degree of a decrease in luminance when the organic EL display device was viewed from a direction oblique to the board compared to that when it was viewed from the direction perpendicular to the board is reduced.

Furthermore, the degree of improvement in the view angle characteristics depends on the light-emitting area, the curvature of the lens 16a, and the distance from the light-emitting face to the lens 16a. The lens 16a can be designed using these factors as parameters.

Figure 3:
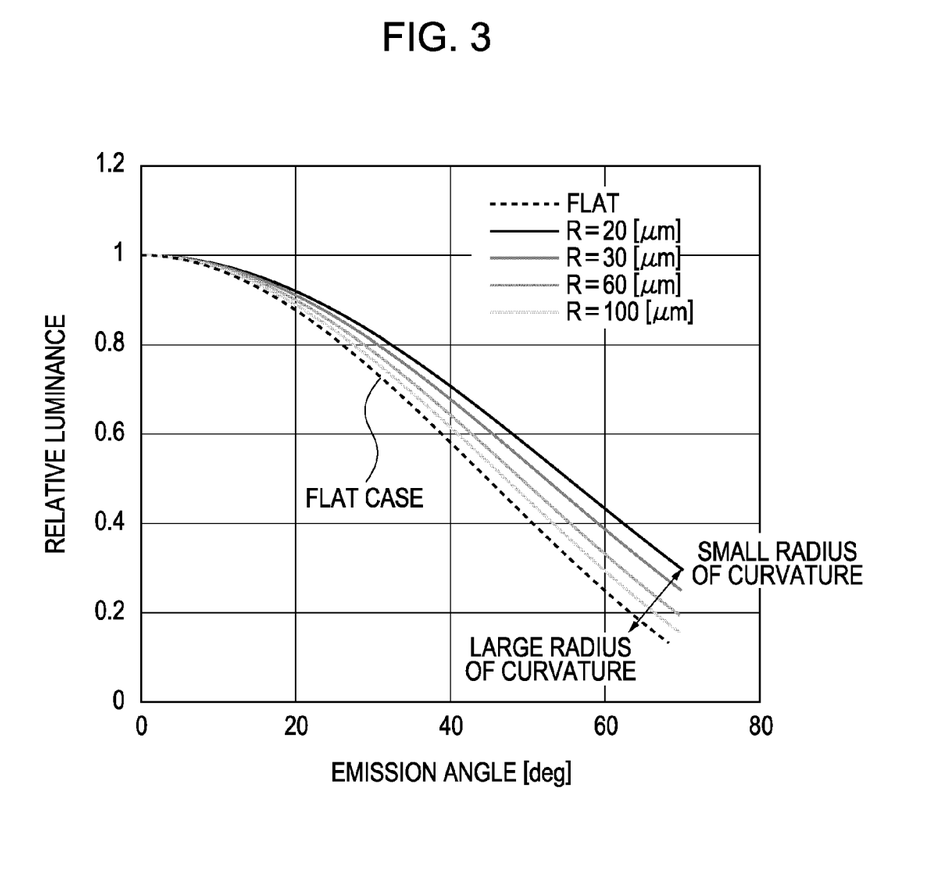
FIG. 3 is a graph showing a correlation between emission angle and relative luminance.

Next, the curvature of the lens 16a and the view angle characteristics will be described. FIG. 3 shows changes in correlation between emission angle and relative luminance when lens curvature radius R (μm) of the lens 16a is varied. The term "flat" in FIG. 3 means a case of not being provided with the lens 16a.

The measurement was carried out for lenses 16a having four different lens curvature radii R (20, 30, 60, and 100 μm). The measurement conditions were as follows: The pixel pitch was 31.5 μm, the maximum width of the lens 16a was 31.5 μm, and the width of the light-emitting region (the light-emitting region of one pixel defined by pixel separation layers) was 16.5 μm. Furthermore, the cathode electrode was made of a mixture of indium oxide and zinc oxide and had a refractive index of 1.9 and a thickness of 0.05 μm. The first protective layer is made of SiN and had a refractive index of 1.83 and a thickness of 0.18 μm. The second protective layer was made of an epoxy resin and had a refractive index of 1.54 and a minimum thickness of 10 μm. The third protective layer was made of SiN and had a refractive index of 1.83 and a thickness of 1 μm. The distance from the light-emitting face to the lens 16a at the position between adjacent pixels, where the second protective layer has the maximum thickness, were 17.7, 14.5, 12.1, and 11.2 μm for the lens curvature radii R 20, 30, 60, and 100 μm, respectively.

The term "relative luminance" means the luminance relatively determined in each structure on the assumption that the luminance when the emission angle is 0 degree is 1.

The emission angle is the angle of spread of light beams emitted from the third protective layer 17. It is confirmed from FIG. 3 that the relative luminance is hard to reduce in those provided with the lenses 16a compared to one not provided with the lenses 16a. Furthermore, it is confirmed that among those provided with the lenses 16a, the relative luminance is hard to reduce in those having smaller lens curvature radius R.

This is because since the lens 16a is a diverging lens, the light beams incident on the lens 16a diverge in-plane direction of the board, which gives a display being bright and having good view angle characteristics, even if the display device is obliquely viewed (the view angle becomes large).

Incidentally, the term "diverging lens" means a lens that enlarges the refracting angle of a light ray obliquely incident on the lens compared to a case of being flat (not having a lens) and has a function of further diverging light beams. Therefore, the refractive index in the region (for example, an air layer or a resin layer) outer than the third protective layer 17 (the upper side of the paper) can be smaller than those in the first protective layer 15, the second protective layer 16, and the third protective layer 17.

Process of Manufacturing Display Device

Figure 4A:
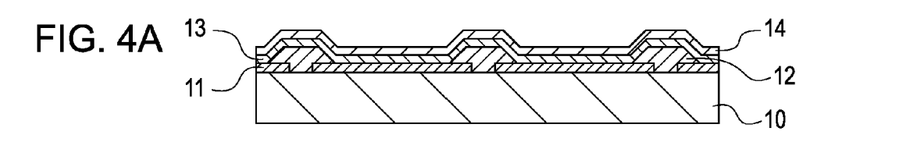
FIG. 4A is a diagram illustrating an embodiment of a process of manufacturing a display device according to aspects of the present invention.

Next, a process of manufacturing a display device according to the embodiment will be described with reference to FIGS. 4A to 4F. FIGS. 4A to 4F are schematic cross-sectional views illustrating each step of a process of manufacturing a display device of the embodiment. Incidentally, since the steps until the cathode electrode 14 is formed are well known manufacturing steps, the descriptions thereof are omitted here. First, as shown in FIG. 4A, a board 10 provided with a plurality of top-emission-type organic EL elements is prepared. The organic EL elements are formed above the board 10 provided with active-matrix pixel circuits (not shown) through an interlayer insulating layer and a planarizing layer (not shown) and comprise anode electrodes 11, pixel separation layers 12, an organic EL layer 13, and a cathode electrode 14.

Figure 4B:
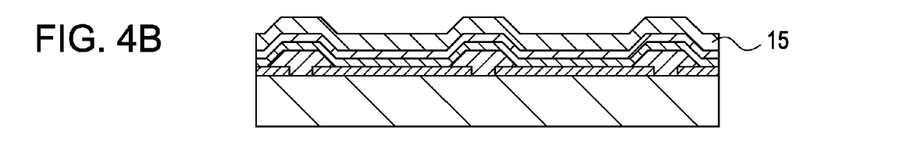
FIG. 4B is a diagram illustrating an embodiment of a process of manufacturing a display device according to aspects of the present invention.

Then, as shown in FIG. 4B, a first protective layer 15 is formed in the entire area of the display region. The first protective layer 15 is a member having a sealing function of preventing moisture contained in the resin material constituting a second protective layer, which is formed on the first protective layer 15, from coming into contact with the organic EL elements. Accordingly, the first protective layer 15 can be a member having a high light transmittance and being excellent in moisture-proof property and can be made of a silicon nitride layer or a silicon oxynitride layer.

Figure 4C:
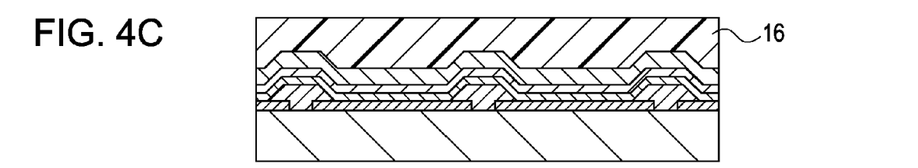
FIG. 4C is a diagram illustrating an embodiment of a process of manufacturing a display device according to aspects of the present invention.

Then, as shown in FIG. 4C, a second protective layer 16 is formed on the first protective layer 15 in the entire region of the display region. The second protective layer 16 is made of a resin material and has a thickness of about 10 μm or more and 100 μm or less so that the second protective layer 16 can sufficiently cover dust such as etching residues and also absorb the asperities of the pixel separation layers 12 made of an acrylic resin. The resin material can be a thermosetting resin, a thermoplastic resin, or a photo-setting resin, which are low in moisture content. When a thermosetting resin or a photo-setting resin is used, the second protective layer 16 can be formed by, for example, spin coating or a dispense method. Alternatively, a thermoplastic resin layer having a thickness of 10 μm or more and 100 μm or less may be laminated on the first protective layer 15 under vacuum. Specific examples of the resin material include epoxy resins and butyl resins.

Figure 4D:
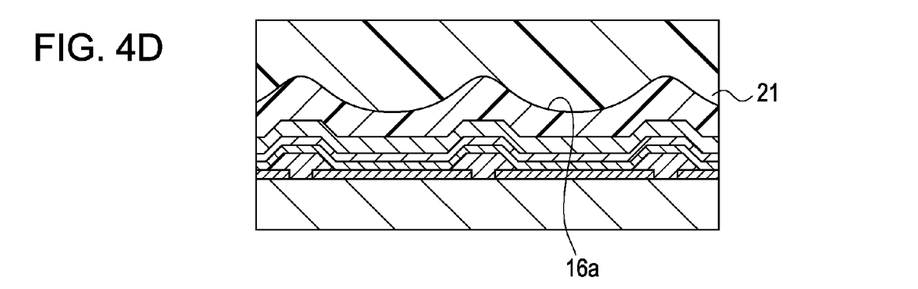
FIG. 4D is a diagram illustrating an embodiment of a process of manufacturing a display device according to aspects of the present invention.

Then, as shown in FIG. 4D, a mold 21 for forming lenses 16a is prepared, and the lenses 16a are formed by pressing the mold 21 to the resin material of the second protective layer 16 while avoiding air bubbles from being included in the resin material.

The mold 21 can be made of a usual metal, but when the resin material is a photo-setting resin, since the mold 21 is required to transmit light, a quartz substrate can be used. Furthermore, in order to enhance the removal of the mold 21 from the resin material, the mold 21 may be provided with a layer such as a fluorine resin layer on the surface.

When the resin material is a thermosetting resin, the mold 21 is placed so that the tops of the mold 21 for forming concave lenses approximately correspond to the centers of the respective pixels, and in such a state, the resin is cured by heating to 80° C.

The curing temperature can be about 80° C., because the heat-proof temperature of an organic compound making up the organic EL layer 13 may be about 100° C.

Figure 4E:
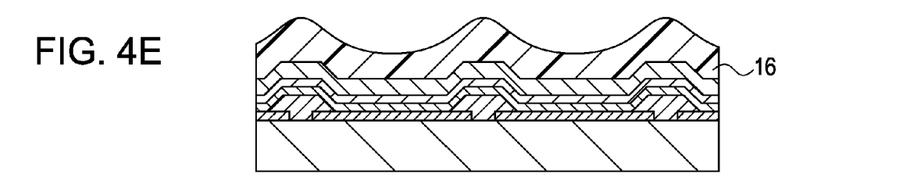
FIG. 4E is a diagram illustrating an embodiment of a process of manufacturing a display device according to aspects of the present invention.

Then, as shown in FIG. 4E, the mold 21 is removed from the cured resin material.

By doing so, lenses 16a corresponding to the respective pixels are formed on the surface of the second protective layer 16.

Incidentally, if the bottom of each concave lens 16a is excessively thin, dust such as etching residues cannot be sufficiently covered, which causes occurrence of pinholes. Therefore, the minimum thickness of the second protective layer 16 at the bottom of the concave can be 1 μm or more. Furthermore, the maximum thickness of the second protective layer 16 at the bottom of each concave lens 16a can be 50 μm or less for preventing a decrease in light quantity due to absorption and a leakage of light emitted from an adjacent pixel.

Figure 4F:
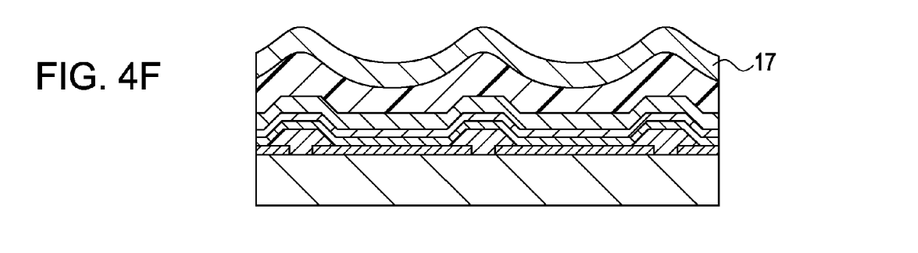
FIG. 4F is a diagram illustrating an embodiment of a process of manufacturing a display device according to aspects of the present invention.

Lastly, as shown in FIG. 4F, the above-described third protective layer 17 is formed on the cured second protective layer 16 in the entire area of the display region. The third protective layer 17 can be a member having a high light transmittance and being excellent in moisture-proof property and can be made of a silicon nitride layer or a silicon oxynitride layer. The first protective layer 15 and the third protective layer 17 may be made of the same material or different materials.

Figure 5:
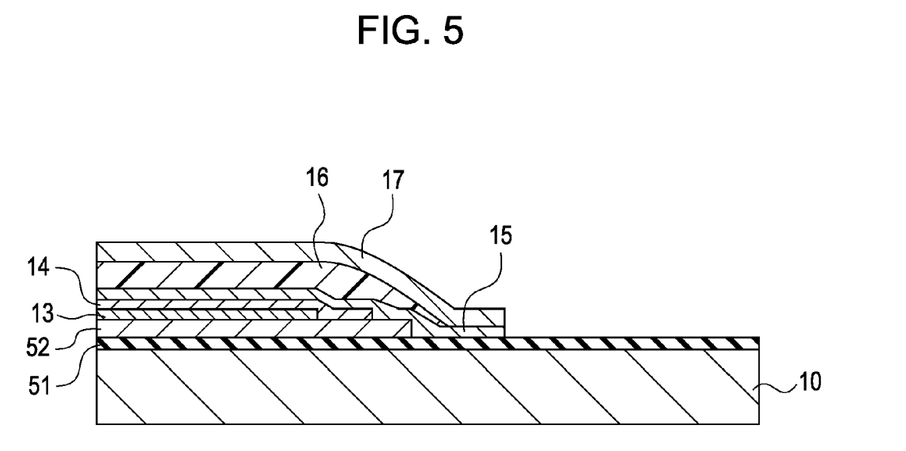
FIG. 5 is a cross-sectional view illustrating a state of a protective layer at the outside of the display region according to an embodiment of the present invention.

Here, in the display device, as shown in FIG. 5, the first protective layer 15 and the third protective layer 17 are in direct contact with each other at the periphery region, which is the outside of the display region provided with the organic EL elements and is not provided with the organic EL elements. Thus, the first protective layer 15 and the third protective layer 17 are formed so as to have the second protective layer 16 therebetween. That is, it is given a structure in which the second protective layer 16 is sealed with the first protective layer 15 and the third protective layer 17.

Therefore, moisture in outside air does not penetrate into the resin material constituting the second protective layer 16.

In addition, as shown in FIG. 5, the first protective layer 15 and the interlayer insulating layer 51, which is formed between the board 10 and the planarizing layer 52, are in direct contact with each other in the peripheral region and are formed so as to have the planarizing layer 52, the organic EL layer 13, the cathode electrode 14, and the pixel separation layers (not shown) therebetween. That is, it is given a structure in which the planarizing layer 52, the organic EL layer 13, the cathode electrode 14, and the pixel separation layers are sealed with interlayer insulating layer 51 and the first protective layer 15. Since the interlayer insulating layer 51 is made of an inorganic material such as silicon nitride or silicon oxynitride and is excellent in moisture-proof property, it can prevent moisture from penetrating into the inside of the display region from the outside through the planarizing layer 52 and the pixel separation layers.

Incidentally, in the steps of forming the lenses 16a shown in FIGS. 4C, 4D, and 4E, a method of direct forming using the mold 21 has been described, but the lenses 16a can also be produced by another method such as any of the following i) to v):

i) a method involving heating a resin layer patterned by, for example, photolithography and deforming the resin layer into a lens shape by reflow;

ii) a method of forming lenses by exposing a photo-setting resin layer having a uniform thickness with light having a distribution in the in-plane direction and developing the resin layer;

iii) a method of processing a surface of a resin material formed so as to have a uniform thickness using ion beams, electron beams, or a laser into a lens shape;

iv) a method of self-alignedly forming lens by dropping a resin in an appropriate amount to each pixel; and v) a method of forming lenses by separately preparing a board provided with organic EL elements and a resin sheet provided with lenses in advance and aligning and bonding them to each other.

The concave lens 16a according to aspects of the present invention may have a hemispherical or a U-shaped semi-cylindrical front face. When the lens is U-shaped semi-cylindrical, the view angle characteristics are particularly improved in either the vertical or horizontal direction. Furthermore, the ends in the length direction of the semi-cylindrical lens may be hemispherical or may be vertical to the board.

Incidentally, the display device according to aspects of the present invention can be applied to, for example, televisions, car navigation systems, and digital camera back monitors, where improvement in view angle characteristics is important.

Aspects of the present invention are not limited to the above-described configurations, and various application and modification are possible as long as it does not deviate from the above-described spirit.

EXAMPLES

Example 1

Pixel circuits (not shown) were formed on a glass substrate with low-temperature polysilicon TFTs, and an interlayer insulating layer of SiN and a planarizing layer of an acrylic resin were formed in this order on the pixel circuits to produce a board 10 shown in FIG. 4A. Then, an ITO layer and an AlNd layer were formed on the board 10 so as to respectively have thicknesses 38 nm and 100 nm by sputtering. Subsequently, the ITO layer and the AlNd layer were patterned for each pixel to form anode electrodes 11.

Then, an acrylic resin was spin coated on the anode electrodes 11 and then was patterned by lithography to form openings (these openings correspond to pixels) at the portions where the anode electrodes 11 were provided to form pixel separation layers 12. The pitch of the pixels was 30 μm, and the size of the exposed portion of each anode electrode 11 due to the opening was 10 μm. Then, ultrasonic cleaning with isopropyl alcohol (IPA), boiling cleaning, and drying were conducted. Furthermore, after UV and ozone cleaning, an organic EL layer 13 was formed by vacuum deposition.

In the formation of the organic EL layer 13, first, a hole-transporting layer with a thickness of 87 nm was formed over the entire pixels. In this step, the degree of vacuum was $1 \times 10^{-4}$ Pa, and the deposition rate was 0.2 nm/sec.

Then, a red light-emitting layer, a green light-emitting layer, and a blue light-emitting layer were formed at thicknesses of 30 nm, 40 nm, and 25 nm, respectively, using a shadow mask.

Subsequently, an electron-transporting layer common for all pixels was formed by vacuum deposition of bathophenanthroline (Bphen) at a thickness of 10 nm. In the vacuum deposition, the degree of vacuum was $1 \times 10^{-4}$ Pa, and the deposition rate was 0.2 nm/sec.

Then, a common electron-injection layer was formed by co-vapor deposition of Bphen and $Cs_2CO_3$ (weight ratio of 90:10) at a thickness of 40 nm. In the vapor deposition, the degree of vacuum was $3 \times 10^{-4}$ Pa, and the deposition rate was 0.2 nm/sec.

Then, the board provided with the organic EL layer 13 including from the hole-transporting layer to the electron-injection layer was transferred to a sputtering apparatus while keeping the vacuum. Then, as a cathode electrode 14, an extremely thin Ag layer and a transparent electrode layer were formed at thicknesses of 10 nm and 50 nm, respectively, in this order. The transparent electrode layer was made of a mixture of indium oxide and zinc oxide.

Then, as shown in FIG. 4B, a first protective layer 15 of silicon nitride was formed by plasma CVD using $SiH_4$ gas, $N_2$ gas, and $H_2$ gas. Then, as shown in FIG. 4C, a second protective layer 16 of a thermosetting resin material (epoxy resin) with a viscosity of 3000 mPa·s was applied with a dispenser (SHOT MINI SL: a product of Musashi Engineering, Inc.), which enables precise drawing, under a nitrogen atmosphere at a dew-point temperature of 60° C.

Before the thermosetting of the resin material, as shown in FIG. 4D, a separately prepared mold 21 for forming lenses 16a was pressed to the surface of the resin material. In the pressing, the positioning was performed by adjusting an alignment mark of the mold 21 to an alignment mark of the board. As a result, the lenses 16a were formed at positions corresponding to the respective pixels. The mold 21 had convex protrusions at the same pitch as the pixel pitch, and the surfaces of the protrusions were coated with a Teflon (registered trademark)-based resin as a release agent. The shape of the protrusion, that is, the shape of the lens 16a, was formed so as to have a curvature radius of 30 μm. The resulting lens array had a pitch of 30 μm and a depth of about 4 μm.

Here, considering the environments of a clean room and a process apparatus, since the purpose of the second protective layer 16 is planarization by a resin material for the case of that foreign substances were present, the minimum thickness (film thickness at the thinnest portion) was determined to be 10 μm. Incidentally, the minimum thickness here was 10 μm, but may be 1 μm or more and 50 μm or less.

The resin material (epoxy resin) was cured by heating at 100° C. for 15 minutes under a vacuum environment in the state that the mold 21 was pressed as described above. Then, the mold 21 was removed from the resin to form the lenses 16a as shown in FIG. 4E.

Furthermore, as shown in FIG. 4F, an inorganic protective layer (third protective layer 17) of silicon nitride was formed by plasma CVD using $SiH_4$ gas, $N_2$ gas, and $H_2$ gas. The third protective layer 17 was formed so as to have a thickness of 1 μm and to cover the entire display region provided with the organic EL elements.

The thus produced display device according to aspects of the present invention was measured for the view angle characteristics and compared to those of a display device not provided with the lenses to confirm that the relative luminance at an emission angle of 60° was increased to approximately 0.4 from approximately 0.25 in the flat case.

In addition, since the second protective layer 16 provided with the lenses is completely sealed with the first protective layer 15 and the third protective layer 17, moisture transmission to the resin does not occur even under a high-temperature and high-humidity environment. Therefore, the resin did not swell and no change occurred in the characteristics of the lenses.

Example 2

A lens array was formed by a process, which is different from that of EXAMPLE 1, as shown in FIGS. 6A to 6E. Incidentally, since the steps until the first protective layer 15 is formed are the same as those in EXAMPLE 1, the descriptions thereof are omitted, and the description will be started from the step of forming the second protective layer 16.

Figure 6A:
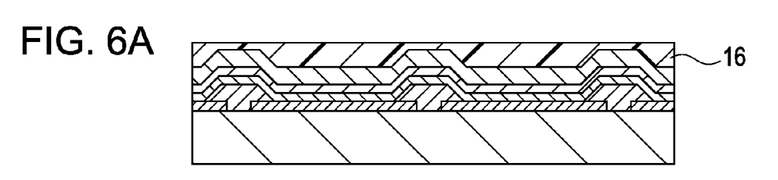
FIG. 6A is a diagram illustrating an embodiment of a process of manufacturing a display device in Example 2 of the present invention.
Figure 6B:
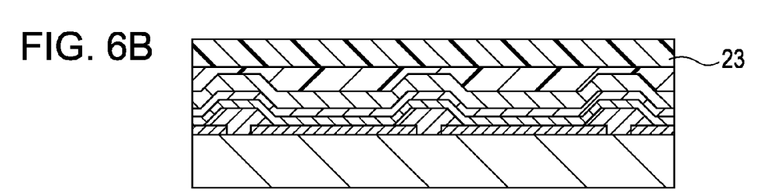
FIG. 6B is a diagram illustrating an embodiment of a process of manufacturing the display device in Example 2 of the present invention.

First, a thermosetting epoxy resin (second protective layer 16 of a thermosetting resin material) with a viscosity of 3000 mPa·s was applied on the first protective layer 15 at a thickness of 10 μm with a dispenser (SHOT MINI SL: a product of Musashi Engineering, Inc.), which enables precise drawing, under a nitrogen atmosphere at a dew-point temperature of 60° C. (FIG. 6A). Then, the epoxy resin was cured by heating at 100° C. for 15 minutes under a vacuum environment.

Figure 6C:
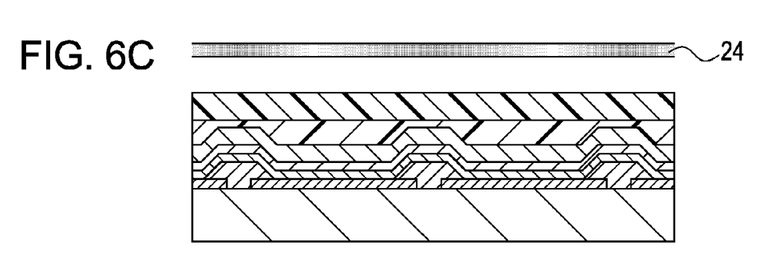
FIG. 6C is a diagram illustrating an embodiment of a process of manufacturing the display device in Example 2 of the present invention.
Figure 6D:
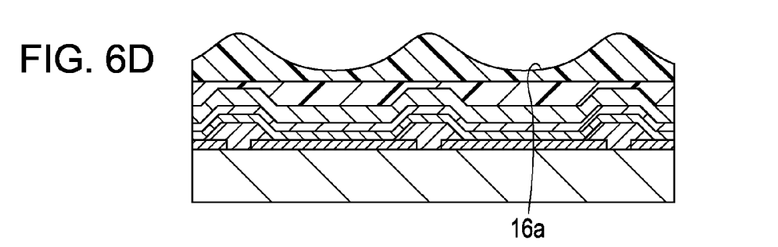
FIG. 6D is a diagram illustrating an embodiment of a process of manufacturing the display device in Example 2 of the present invention.

Subsequently, the same resin 23 was applied on the second protective layer 16 at a thickness of 4 μm (FIG. 6B) and was exposed from above with a photomask 24 (FIG. 6C). The exposure quantity was determined to have a two-dimensional distribution converted from the shape of lenses 16a. The exposed resin was developed to form the lenses 16a having a predetermined shape (FIG. 6D). In-plane control of the exposure quantity was performed by in-plane control of the transmittance of the photomask 24. Then, the resin was cured by heating again at 100° C. for 15 minutes under a vacuum environment. This heat treatment also has a function of smoothening the surfaces of the lenses. In addition, since the purpose is to embed foreign substances, when they are present, in the resin material, the minimum thickness (film thickness at the thinnest portion) of the second protective layer 16 was determined to be 10 μm. The minimum thickness may be 1 μm or more and 50 μm or less.

Figure 6E:
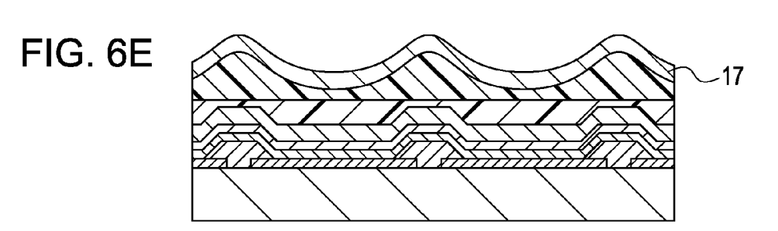
FIG. 6E is a diagram illustrating an embodiment of a process of manufacturing the display device in Example 2 of the present invention.

Finally, an inorganic protective layer (third protective layer 17) of silicon nitride was formed by plasma CVD using $SiH_4$ gas, $N_2$ gas, and $H_2$ gas. The third protective layer 17 was formed so as to have a thickness of 1 μm and to cover the entire area of the display region provided with the organic EL elements (FIG. 6E).

Figure 7:
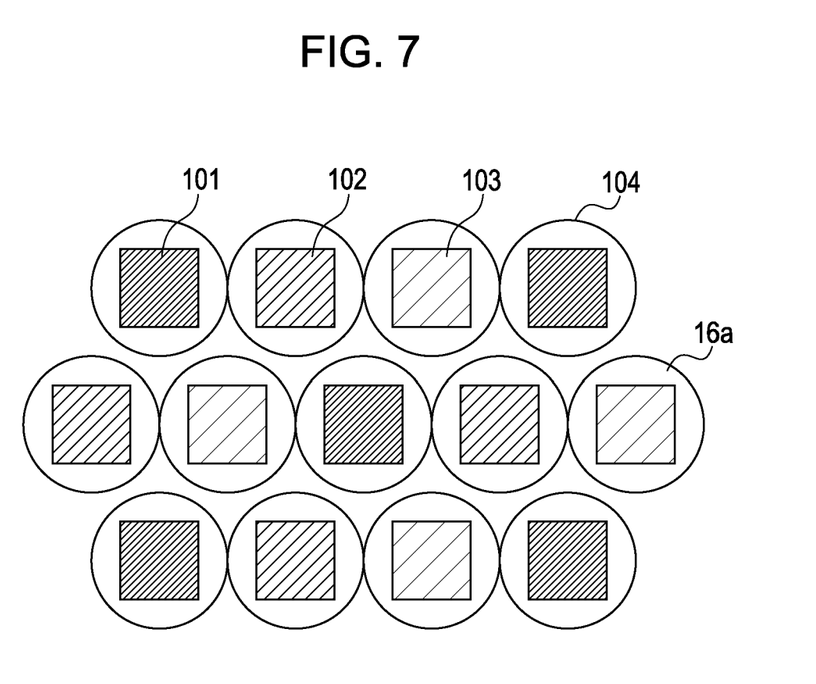
FIG. 7 is a diagram illustrating a pixel array and a concave lens shape of a display device according to aspects of the present invention.

Incidentally, in the above-described EXAMPLES, the arrangement of the pixels is not referred, but the shape of the lenses 16a can be formed as follows, according to the arrangement of the pixels. FIG. 7 is a front view of a display device according to aspects of the present invention. As shown in FIG. 7, when the arrangement of pixels is an RGB delta arrangement, the lens 16a can be formed such that the outer shape when it is viewed from the front side of the display device is a circle. In FIG. 7, reference number 101 denotes an R (red light-emitting) pixel, reference number 102 denotes a G (green light-emitting) pixel, and reference number 103 denotes a B (blue light-emitting) pixel. Furthermore, reference number 104 shows the outer shape of the lens 16a. In FIG. 7, the RGB pixels are each provided with one lens 16a.

Figure 8A:
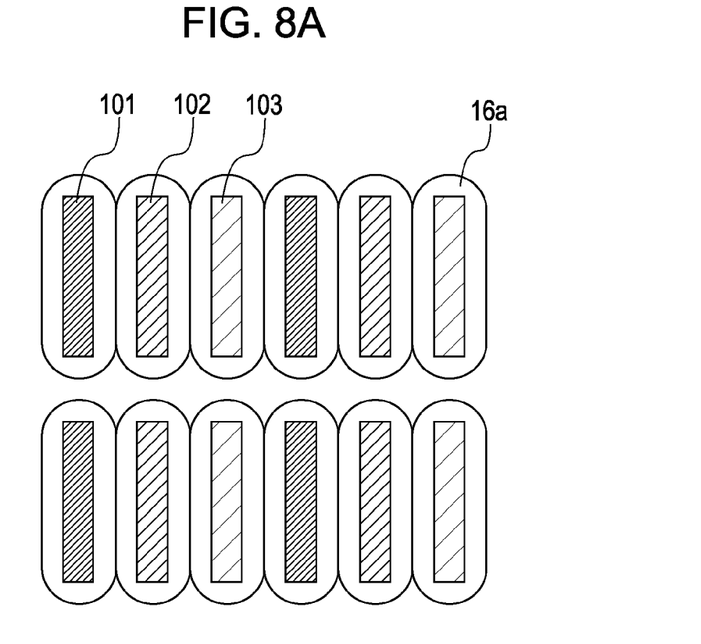
FIG. 8A is a front view illustrating another pixel array and a concave lens shape of a display device according to aspects of the present invention.
Figure 8B:
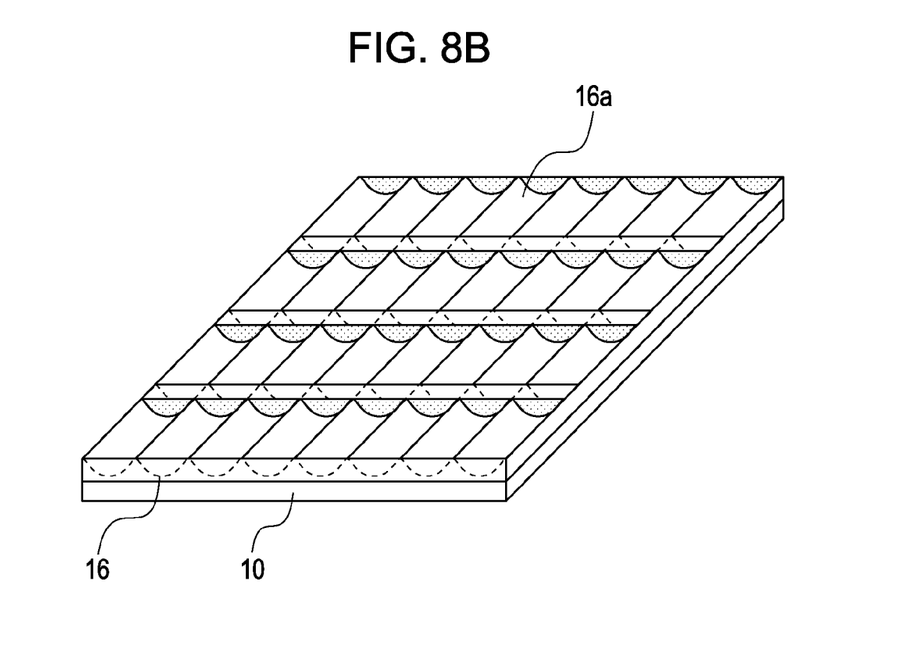
FIG. 8B is a perspective view illustrating the pixel array and the concave lens shape of the display device according to aspects of the present invention.

As shown in FIGS. 8A and 8B, when the pixels are arranged in a stripe arrangement, an elongated semicylindrical concave lens 16a can be formed so as to cover one pixel (organic EL element). Here, the same structure as that in FIG. 7 is shown with the same reference number. FIG. 8A is a front view of a display device according to aspects of the present invention. As shown in FIG. 8A, the RGB pixels are each provided with one lens 16a. FIG. 8B is a perspective view of the display device shown in FIG. 8A. In FIG. 8B, the first protective layer and the third protective layer are not shown. In the case of the lens array shown in FIGS. 8A and 8B, the view angle characteristics in the vertical direction of FIG. 8A were not improved, and the view angle characteristics toward the front were improved only in the horizontal direction of FIG. 8A.

Figure 9A:
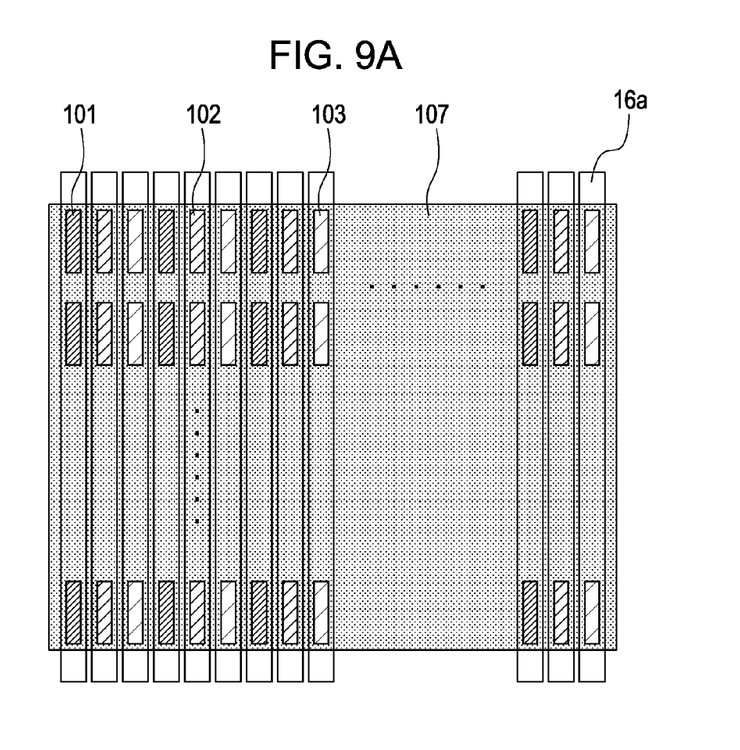
FIG. 9A is a front view illustrating further another pixel array and a concave lens shape of a display device according to aspects of the present invention.
Figure 9B:
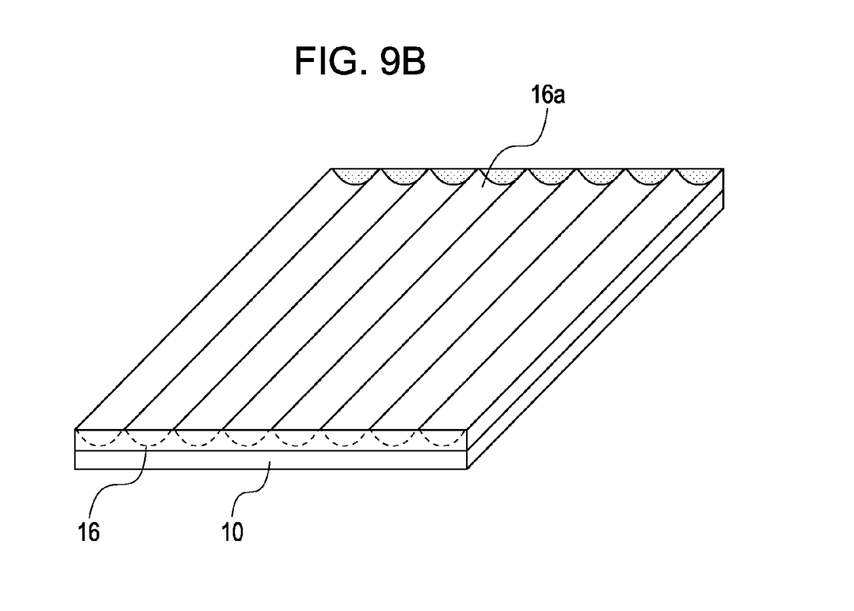
FIG. 9B is a perspective view illustrating the pixel array and the concave lens shape of the display device according to aspects of the present invention.

FIGS. 9A and 9B show a modification of the elongated semicylindrical lenses 16a shown in FIGS. 8A and 8B. In this example, elongated semicylindrical lenses 16a are successionally formed over the display region 107 in such a manner that one lens 16a corresponds to a plurality of pixels (organic EL elements) arranged in each column direction (the vertical direction of the paper). Here, the same structure as that in FIG. 7 is shown with the same reference number.

As shown in FIGS. 9A and 9B, lenses 16a each had a shape narrow and long in the vertical direction of the paper and were formed such that one lens 16a was common to pixels aligned in a line in the vertical direction of FIG. 9A. Specifically, one elongated semicylindrical lens 16a was formed for each alignment of R pixels, G pixels, and B pixels. The effect of improving the view angle characteristics is the same as that in the lenses shown in FIGS. 8A and 8B. That is, the view angle characteristics in the vertical direction of FIG. 9A were not improved, and the view angle characteristics toward the front were improved only in the horizontal direction of FIG. 9A.

Furthermore, in addition to the above-mentioned examples, elongated semicylindrical lenses 16a may be formed such that a plurality of the lenses 16a correspond to a plurality of pixel groups aligned in a line from one end to the other end of the display region 107 in the vertical direction of the paper (not shown).

In addition, in the delta arrangement of RGB pixels shown in FIG. 7, the lenses may have a shape narrow and long in the horizontal direction of FIG. 7. In such a case, the view angle characteristics are not improved in the horizontal direction of FIG. 7, and the view angle characteristics toward the front can be improved only in the vertical direction of FIG. 7.

Aspects of the present invention may thus provide a display device having organic EL elements with a reduced occurrence of dark spots, and that achieve satisfactory view angle characteristics and also can be produced at low cost.

According to aspects of the present invention, particles such as etching residues and dust can be sufficiently covered with the second protective layer made of a resin material, which readily allows an increase in the thickness, and the view angle characteristics of light are improved by the function of the lenses. Furthermore, since the third protective layer made of an inorganic material is disposed on the surfaces of the lenses, the lenses are prevented from being changed with the passage of time, which stably increases the view angle characteristics of light. Furthermore, since the second protective layer made of a resin material is provided with the lenses without forming additional resin layer for the lenses, the total number of layers can be reduced, which leads a reduction in manufacturing cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-230648 filed Oct. 2, 2009, which is hereby incorporated by reference herein in its entirety.

What is claimed is:

1. A display apparatus comprising:
a plurality of organic EL elements and
a protective layer disposed on the plurality of the organic EL elements, wherein
the protective layer comprises a first protective layer made of an inorganic material, a second protective layer made of a resin material and disposed on the first protective layer, and a third protective layer made of an inorganic material and disposed on the second protective layer;
the second protective layer includes lenses for diverging at least part of light emitted from the organic EL element;
the display apparatus including a display region provided with the organic EL elements and a periphery region disposed around the display region; and
the first protective layer and the third protective layer are in contact with each other in the periphery region.

2. The display apparatus according to claim 1, wherein the lenses are arranged in such a manner that one lens corresponds to one organic EL element.

3. The display apparatus according to claim 1, wherein the shape of lens is an elongated concave.

4. The display apparatus according to claim 1, the lens is common to a plurality of organic EL elements.

5. The display apparatus according to claim 1,
further comprising a planarizing layer;
the organic EL element disposed on the planarizing layer;
wherein the first protective layer is in contact with the planarizing layer in the periphery region.

6. The display apparatus according to claim 5,
further comprising an interlayer insulating layer made of an inorganic material;
the planarizing layer disposed on the interlayer insulating layer,
wherein the first protective layer is in contact with the interlayer insulating layer in the periphery region.

7. The display apparatus according to claim 1, wherein the second protective layer has a thickness of 1 µm or more and 50 µm or less.

8. A digital camera comprising the display apparatus according to claim 1.

9. A car navigation system comprising the display apparatus according to claim 1.

* * * * *